(12) United States Patent
Huang et al.

(10) Patent No.: US 12,159,947 B2
(45) Date of Patent: Dec. 3, 2024

(54) ELECTRODE PASTE IN CONTACT WITH P+ EMITTER OF N-TYPE SOLAR CELL

(71) Applicants: Guangzhou Ruxing Technology Development Co., Ltd., Guangdong (CN); Wuxi Ruxing Technology Development Co., Ltd., Jiangsu (CN)

(72) Inventors: Ming Huang, Guangdong (CN); Qian Sun, Guangdong (CN); Bingbing Ding, Guangdong (CN)

(73) Assignees: Guangzhou Ruxing Technology Development Co., Ltd., Guangzhou (CN); Wuxi Ruxing Technology Development Co., Ltd., Wuxi (CN)

( * ) Notice: Subject to any disclaimer, the term of this patent is extended or adjusted under 35 U.S.C. 154(b) by 0 days.

(21) Appl. No.: 17/766,219

(22) PCT Filed: Sep. 17, 2021

(86) PCT No.: PCT/CN2021/118931
§ 371 (c)(1),
(2) Date: Apr. 1, 2022

(87) PCT Pub. No.: WO2022/116646
PCT Pub. Date: Jun. 9, 2022

(65) Prior Publication Data
US 2024/0290895 A1    Aug. 29, 2024

(30) Foreign Application Priority Data
Dec. 1, 2020 (CN) .......................... 202011391902.4

(51) Int. Cl.
*H01L 31/0224* (2006.01)

(52) U.S. Cl.
CPC .......................... *H01L 31/022425* (2013.01)

(58) Field of Classification Search
CPC ............. H01L 31/022425; C03C 3/074; C03C 3/0745; C03C 8/10; C03C 8/18; H01B 1/22; H01B 1/16
See application file for complete search history.

(56) References Cited

FOREIGN PATENT DOCUMENTS

| CN | 104810076 A | | 7/2015 | |
| CN | 106448805 B | * | 1/2018 | |
| TW | 201037841 A | * | 10/2010 | ........... C23C 14/025 |
| WO | WO-2018135430 A1 | * | 7/2018 | ............... H01B 1/00 |

OTHER PUBLICATIONS

English machine translation of WO-2018135430-A1 (Year: 2024).*
English machine translation of CN-106448805-B (Year: 2024).*
English machine translation of TW-201037841-A (Year: 2024).*

* cited by examiner

*Primary Examiner* — Angelo Trivisonno

(57) ABSTRACT

The invention discloses an electrode paste in contact with a p+ emitter of an N-type solar cell, and relates to the technical field of photovoltaic cells. The electrode paste of the present invention comprises the following components by weight: 80-90 parts of a conductive silver powder, 0.5-3 parts of an aluminum powder, 3-8 parts of a glass powder, 0.1-2 parts of a lanthanum-aluminum alloy powder or lanthanum-ytterbium-aluminum alloy powder, 6-10 parts of an organic vehicle and 0-2 parts of an auxiliary agent. By selecting the components and formulations of the electrode paste, the electrode pastes of present invention obtained improve the conversion efficiency of a N-type solar cell that can exceed 23.5% after the electrode paste being applied to the N-type solar cell.

13 Claims, No Drawings

ELECTRODE PASTE IN CONTACT WITH P+ EMITTER OF N-TYPE SOLAR CELL

TECHNICAL FIELD

The invention relates to the technical field of photovoltaic cells, in particular to an electrode paste in contact with a p+ emitter of an N-type solar cell.

BACKGROUND

At present, the mainstream solar cells in the photovoltaic market are p-type PERC (Passivated Emitter and Rear Contact) solar cells. The rear surface of PERC solar cells is passivated with dielectric coating, and laser opening is performed to achieve local area metal contact, which greatly reduces the rear surface recombination velocity, while improves the light reflection of the rear surface. The PERC solar cell is a p-type cell with a phosphorus-doped n+ emitter structure on the front surface, and the conversion efficiency is around 23%.

Currently, p-type solar cell occupies the absolute share of the crystalline silicon solar cell market, but with the sharp increase in the market demand for high-efficiency solar cells and high-power photovoltaic modules, n-type solar cells having the advantages of higher minority carrier lifetime and less light-induced degradation than conventional p-type solar cells and a conversion efficiency exceeding 24% become the development direction of high-efficiency solar cells in the future. Common n-type solar cells include n-PERT solar cell, TOPCon solar cell, and HJT solar cell. Among them, n-PERT solar cell and TOPCon solar cell can be produced with the current PERC production line after simple equipment transformation, which has attracted widespread attention in the market. The front surfaces of n-PERT solar cells and TOPCon solar cells are a boron-doped p+ emitter. If a paste in contact with an n+ emitter is used, a good ohmic contact will not be formed, resulting in low conversion efficiency of the cell. Therefore, development of an electrode paste that can form good ohmic contact with the boron-doped p+ emitter is one of the key factors for the large-scale application of n-PERT solar cells and TOPCon solar cells in the future.

The electrode paste of Chinese patent CN201510207047.X is added with aluminum-silicon alloy powder, which forms heavy doping on the p+ emitter through diffusion, so that the silver-silicon contact forms a high conductive path, reduces the contact resistance, and realizes ohmic contact with the p+ emitter. However, in order to reduce metal induced recombination, the current manufacturers use low-temperature firing process to produce n-PERT solar cells and TOPCon solar cells. This patent only adds aluminum-silicon alloy powder, the silicon in which will inhibit the inter-diffusion of aluminum and silicon at the interface. Sufficient silver-aluminum-silicon contact points cannot be formed during the firing, and it is difficult to form ohmic contact with the p+ emitter. On the other hand, the introduction of a large amount of silicon will cause the bulk resistance to increase, thereby further increasing the series resistance, and addition of large quantity of aluminum-silicon alloy powder will also lead to poor printing when the finger opening are narrow (<30 microns).

The problem of low temperature firing can be solved by increasing corrosivity of the glass frit, but it is easy to make the silver-aluminum contact point grow too large, fire through the PN junction, and cause the metal induced recombination at the contact position to be too large. How to balance the relationship between ohmic contact and metal induced recombination is also a big problem.

SUMMARY OF THE INVENTION

The purpose of the present invention is to overcome the above-mentioned shortcomings of the prior art and provide an electrode paste in contact with a p+ emitter of an N-type solar cell, and when the paste is printed on the p+ emitter of the N-type solar cell, the metal induced recombination is low, the contact resistivity is small and the conversion efficiency of the cell is high.

In order to achieve the above purpose, the technical solution adopted in the present invention is: an electrode paste in contact with a p+ emitter of an N-type solar cell, comprising the following components by weight: 80-90 parts of a conductive silver powder, 0.5-3 parts of an aluminum powder, 3-8 parts of a glass powder, 0.1-2 parts of a lanthanum-aluminum alloy powder or a lanthanum-ytterbium-aluminum alloy powder, 6-10 parts of an organic vehicle and 0-2 parts of an auxiliary agent.

By adding the lanthanum-aluminum alloy powder or lanthanum-ytterbium-aluminum alloy powder in the electrode paste of the present invention, effective aluminum doping can be formed in the present invention, while the metal induced recombination at the contact position is reduced, which well balance the relationship between ohmic contact and metal induced recombination. By selecting the formulation of each component, the conversion efficiency of the solar cell printed with the electrode paste can be higher than 23.5%.

Preferably, the mass fraction of aluminum in the lanthanum-aluminum alloy powder or the lanthanum-ytterbium-aluminum alloy powder is ≥99.1%; the particle size D50 of the lanthanum-aluminum alloy powder or the lanthanum-ytterbium-aluminum alloy powder is 0.5-5 μm.

Preferably, the particle size $D_{50}$ of the lanthanum-aluminum alloy powder or the lanthanum-ytterbium-aluminum alloy powder is 1-3 μm.

Preferably, the conductive silver powder comprises silver powder and/or silver alloy powder. The silver powder may include silver particles composed of spherical silver powder, flake silver powder, microcrystalline silver powder and mixtures thereof. The silver alloy can be alloy formed by silver and one or more other metals such as copper, and the mass percentage of silver is greater than 99%.

Preferably, the silver powder may be a mixture of a spherical silver powder and a microcrystalline silver powder, and the mass fraction of the spherical silver powder is ≥80%, wherein the particle size $D_{50}$ of the spherical silver powder is 0.1-5 μm; the microcrystalline silver powder is nano-silver powder, and its particle size $D_{50}$ is 10-400 nm.

Preferably, the particle size $D_{50}$ of the spherical silver powder is 0.5-3 μm, and the particle size of the microcrystalline silver powder is 50-200 nm; the tap density of the spherical silver powder is >4.0 g/cm$^3$, and the tap density of the microcrystalline silver powder is >2.0 g/cm$^3$.

Preferably, the particle size $D_{50}$ of the aluminum powder is 1-3 μm, and its particle size $D_{100}$ is less than 10 μm. If the aluminum powder particle size is too large, the printing performance of a fine grid will be affected. The activity of aluminum powder is determined by redox titration and the result of which indicates that the active aluminum mass fraction is 98.3-99.8%. Too low activity will weaken the reaction between the aluminum and silicon, which is not conducive to the formation of ohmic contact. Too high activity will make the reaction between the aluminum and silicon too strong, a grown silver-aluminum-silicon contact point will be too large, and it is easy to pierce the PN junction, resulting in increased metal induced recombination. Besides, too high activity makes the aluminum powder unstable and easily oxidized, which affects batch-to-batch stability in the paste preparation.

The main function of aluminum powder: During the firing process, the glass powder will break the passivation layer, and the aluminum powder in the paste will contact with silicon to induce an aluminum-silicon reaction when the temperature exceeds 577° C., forming a silver-aluminum-silicon contact point which is a high conductive path, then an ohmic contact is achieved.

Preferably, the glass powder comprises lead oxide, silicon dioxide, zinc oxide, a third main group oxide, a fluxing agent, and a lanthanide oxide in a molar ratio of: lead oxide: silicon dioxide: zinc oxide: third main group oxide: fluxing agent: lanthanide oxide=(30-60): (3-15):(3-15):(20-50): (1-15):(1-10).

Preferably, the glass powder is a low-melting Pb—Zn—Si system glass powder, and the third main group oxide may be $B_2O_3$, $Al_2O_3$, $Ga_2O_3$, $In_2O_3$, or one or more substances that can generate the above oxides by heating. In particular, the third main group oxide in the glass powder of the present invention do not include $Tl_2O_3$. One role of the third main group oxide is to help the formation of glass, and another is to enhance the p-type doping concentration in the silicon to facilitate the formation of ohmic contacts.

Preferably, the fluxing agent comprises at least one of alkali metal oxides, alkaline earth metal oxides, and fluorine-containing fluxing agents. Wherein, the alkali metal oxides may be $Na_2O$, $Li_2O$, $K_2O$ or one or more substances that can generate the above oxides by heating, and the alkaline earth metal oxides may be BaO, CaO, SrO, MgO or may be one or more substances that can generate the above alkaline earth metal oxides by heating. The fluorine-containing fluxing agent may include at least one of $PbF_2$, $AlF_3$, NaF, LiF, KF, $CaF_2$, $Na_3AlF_6$. One function of the fluxing agent is to reduce the processing temperature of the glass and help the melting of the glass; the other is to reduce the softening point of the glass, so that the glass can completely corrode the passivation layer on the front surface under low temperature firing conditions, and help forming an ohmic contact between the electrode paste and the p+ emitter.

Preferably, the lanthanide oxide may be $La_2O_3$, $Yb_2O_3$, $Ce_2O_3$, $Gd_2O_3$, $Eu_2O_3$, $Tb_2O_3$ or one or more of the substances that can generate the above oxides by heating. The first effect of the lanthanide oxide is to increase the impurity level in the silicon that makes it easier for carriers to transition between energy levels, further enhance the contact performance between the electrode paste and the p+ emitter. Secondly, lanthanides have strong reducibility which can reduce the dissolved silver ion in the glass to silver crystallites or silver sol, increasing the conductive path.

Preferably, the softening point of the glass powder is 350-450° C. Too high softening point will cause the glass to soften at a later stage, and the corrosion of the passivation layer will be incomplete, resulting in a late and weaker reaction between the aluminum and silicon. It is difficult to form ohmic contacts. Too low softening point will make the softening and leveling of the glass take place too soon, leading to an excessive reaction between the aluminum and silicon and excessive growth of the silver-aluminum-silicon contact points. It is easy to fire through the PN junction, and increase the metal induced recombination.

Preferably, the particle size $D_{50}$ of the glass powder is 1.0-2.5 μm.

Preferably, the organic vehicle comprises the following components: a solvent, an organic resin, a dispersant and a thixotropic agent in a weight ratio of: solvent: organic resin: dispersant: thixotropic agent=(60-80):(5-20): (1-5):(1-5).

Preferably, the solvent may include at least two selected from the group consisting of texanol (2,2,4-Trimethyl-1,3-pentanediol monoisobutyrate), butyl carbitol, butyl carbitol acetate, propylene glycol butyl ether, and dimethyl adipate; the organic resin may include at least one selected from the group consisting of ethyl cellulose, acrylic resin, and polyvinyl butyral ester (PVB). The dispersant may be selected from commonly used dispersing agents in the field, to disperse the powder, adjust the viscosity and stabilize the vehicle. The thixotropic agent may be a modified polyamide wax, playing the role of adjusting the thixotropy of the paste.

The auxiliary agent may include an organic additive and an inorganic additive; the organic additive can be selected from the surfactants, thixotropic agents, thickeners, leveling agents, etc. commonly used in the field according to the performance requirements of the paste; the inorganic additive may include at least one of aluminum-silicon alloy powders and aluminum-boron alloy powders. Wherein, the aluminum-silicon alloy powder may be selected from $Al_{88}Si_{12}$, $Al_{80}Si_{20}$ or $Al_{60}Si_{40}$. Its particle size $D_{50}$ is 1-3 μm, and the particle size $D_{100}$ is less than 10 μm. The function of the aluminum-silicon alloy powder is to introduce silicon into the paste, reduce the concentration gradient of silicon, and inhibit the expansion of silicon in the paste during the aluminum and silicon reaction and reduces metal recombination. The mass percentage of boron in the aluminum-boron alloy powder is 0.1-0.5%, the particle size $D_{50}$ is 1-3 μm, and the particle size $D_{100}$ is less than 10 μm. The function of aluminum-boron alloy powder is to increase the doping source of p-type impurities and the doping concentration, lower the contact barrier to facilitate the formation of ohmic contacts.

Meanwhile, the Present Invention Also Discloses a Preparation Method of the Electrode Paste, Comprising the Following Steps:

(1) Mixing lead oxide, silicon dioxide, zinc oxide, a third main group oxide, a fluxing agent and a lanthanide oxide uniformly, smelting a resulting mixture at 900-1100° C. for 30-90 min, quenching with water, ball milling for 6-15 h to obtain a glass slurry, letting the glass slurry stand still to separate and remove a supernatant clear liquid, and drying a resulting solid residue at 100-150° C. to obtain a glass powder;

(2) Mixing the glass powder, a conductive silver powder, an aluminum powder, a lanthanum-aluminum alloy powder or a lanthanum-ytterbium-aluminum alloy powder, an organic vehicle and an auxiliary agent uniformly, and grinding to obtain a electrode paste with a fineness of ≤10 μm.

Compared with the prior art, the beneficial effects of the present invention are:

1) The present invention can adapt to the low-temperature firing process currently used in the production line, and can fire through the passivation layer and form a good ohmic contact with the p+ emitter under the low-temperature firing condition.

2) The third main group element is introduced in the glass powder of the present invention to enhance the p-type doping concentration, and lanthanide element is furthered introduced to increase the impurity energy level in silicon, so that the carrier transition is more likely to occur between energy levels, the contact performance between the electrode paste and the p+ emitter is further enhanced.

3) In addition to aluminum powder, the present invention also adds metal additives such as lanthanum-aluminum alloy powder, which can form effective aluminum doping, reduce metal recombination at the contact position, and can well balance the relationship between ohmic contact and metal recombination.

DETAILED DESCRIPTION OF ILLUSTRATED EXAMPLES

In order to better illustrate the purpose, technical solutions and advantages of the present invention, the present invention will be further described below with reference to specific embodiments.

Example 1

An embodiment of the electrode paste in contact with the p+ emitter of an N-type solar cell according to the present invention, including the following components by weight:

85 parts of a conductive silver powder, 2 parts of an aluminum powder, 5 parts of a glass powder, 1 part of a lanthanum-aluminum alloy powder, 8 parts of an organic vehicle, 1 part of an auxiliary agent;

The conductive silver powder has a weight ratio of spherical silver powder and nano-silver powder in 4:1; the particle size $D_{50}$ of the spherical silver powder is 2 μm, and the particle size $D_{50}$ of the nano-silver powder is 100 nm;

The activity of the aluminum powder is 99.0%, and its particle size $D_{50}$ is 2 μm;

The formulation of the glass powder is shown in Table 1;

The particle size $D_{50}$ of the lanthanum-aluminum alloy powder is 2 μm, and the aluminum mass fraction is 99.5%;

The organic vehicle comprises texanol, butyl carbitol acetate, ethyl cellulose, a dispersant and modified polyamide wax in a weight ratio of texanol: butyl carbitol acetate: ethyl cellulose: dispersant (BYK118): modified polyamide wax=40:30:12:3:5;

The auxiliary agent includes $Al_{88}Si_{12}$ and BYK110 in a weight ratio of 3:2.

The preparation method of the electrode paste described in this embodiment includes the following steps:

(1) Mixing lead oxide, silicon dioxide, zinc oxide, the third main group oxide, the fluxing agent and the lanthanide oxide uniformly, smelting at 1000° C. for 60 minutes, quenching with water, ball milling for 12 hours to obtain a glass paste, letting the glass paste standing still to separate and remove a supernatant clear liquid, and drying a solid residue at 120° C. to obtain glass powder;

(2) Mixing the glass powder, the conductive silver powder, the aluminum powder, the lanthanum-aluminum alloy powder or lanthanum-ytterbium-aluminum alloy powder, the organic vehicle and the auxiliary agent uniformly, and grinding to obtain the electrode paste having a fineness of ≤10 μm.

Example 2

An embodiment of the electrode paste in contact with the p+ emitter of an N-type solar cell according to the present invention, the formulations of the electrode paste of this embodiment and the preparation method are the same as Example 1, except that the particle size $D_{50}$ of the aluminum powder is 1 μm.

Example 3

An embodiment of the electrode paste in contact with the p+ emitter of an N-type solar cell according to the present invention, the formulations of the electrode paste of this embodiment and the preparation method are the same as Example 1, except that the particle size $D_{50}$ of the aluminum powder is 3 μm.

Example 4

An embodiment of the electrode paste in contact with the p+ emitter of an N-type solar cell according to the present invention, the formulation of the electrode paste of this embodiment and the preparation method are the same as Example 1, except that the activity of the aluminum powder is 98.3%.

Example 5

An embodiment of the electrode paste in contact with the p+ emitter of an N-type solar cell according to the present invention, the formulation of the electrode paste of this embodiment and the preparation method are the same as Example 1, except that the activity of the aluminum powder is 99.8%.

Example 6

An embodiment of the electrode paste in contact with the p+ emitter of an N-type solar cell according to the present invention, the formulation of the electrode paste of this embodiment and the preparation method are the same as Example 1, except that the conductive silver powder is all spherical silver powder.

Embodiment 7-9

In the embodiments of the electrode paste in contact with the p+ emitter of the N-type solar cell according to the present invention, in the electrode pastes described in Embodiments 7 to 9, the other formulations and preparation method are the same as those in Embodiment 1 except for the formulation of glass powder. The formulation of the glass powder is shown in Table 1, and the softening point and particle size of the glass powder are shown in Table 2.

TABLE 1

| Formulation of the glass powder (molar percentage) | | | | |
|---|---|---|---|---|
| Item | Example 1 | Example 7 | Example 8 | Example 9 |
| PbO | 45 | 30 | 50 | 60 |
| $SiO_2$ | 12 | 15 | 3 | 3 |
| ZnO | 3 | 10 | 15 | 5 |
| Third main group oxide | 20 $B_2O_3$ 10 $Al_2O_3$ | 32 $B_2O_3$ 3 $In_2O_3$ | 20 $B_2O_3$ 2 $Ga_2O_3$ | 18 $B_2O_3$ 2 $Ga_2O_3$ |
| Fluxing agent | 5 $Li_2O$ | 3 CaO | 8 $Na_3AlF_6$ | 11 CaO |
| lanthanide oxide | 5 $Yb_2O_3$ | 7 $La_2O_3$ | 2 $Ce_2O_3$ | 1 $La_2O_3$ |

TABLE 2

| Item | Example 1 | Example 7 | Example 8 | Example 9 |
|---|---|---|---|---|
| Soften point/° C. | 390 | 420 | 360 | 350 |
| $D_{50}$/μm | 1.7 | 2.0 | 1.2 | 1.0 |

Examples 10-11

Table 3 shows the formulations of the electrode pastes in contact with the p+ emitter of the N-type solar cell according to the present invention. Wherein, the specific components of conductive silver powder, aluminum powder, glass powder, lanthanum-aluminum alloy powder, organic vehicle and auxiliary agent are the same as those of Example 1, and the preparation method is also the same as that of Example 1

TABLE 3

| | Formulations (weight parts) | |
|---|---|---|
| Item | Example 10 | Example 11 |
| Conductive silver powder | 80 | 90 |
| Aluminum powder | 0.5 | 3 |
| Glass powder | 3 | 8 |
| lanthanum-aluminum alloy powder | 0.1 | 2 |
| Organic vehicle | 6 | 10 |
| Auxiliary agent | 0 | 2 |

Comparative Example 1

An electrode paste, which has the same formulations and preparation method as in Example 1 except that the active aluminum content in the aluminum powder is 97.5%.

Comparative Example 2

An electrode paste, which has the same formulations and preparation method as in Example 1 except that no lanthanum-aluminum alloy powder is added.
Performance Testing The electrode paste of examples 1-11 and the comparative examples 1-2 were printed on the front surface of a N-type TOPCon solar cell for testing, and the conversion efficiency were tested using an IV tester. The contact resistivity was tested using the TLM method, and the metal induced recombination was tested using Suns-Voc. The results are shown in Table 4.

TABLE 4

| | Performance test results | | |
|---|---|---|---|
| Item | Specific contact resistivity/ $mQ \cdot cm^2$ | Metal induced recombination/ $fA \cdot cm^-$ | Conversion efficiency/ % |
| Example 1 | 1.2 | 532 | 23.75 |
| Example 2 | 2.5 | 312 | 23.69 |
| Example 3 | 0.6 | 724 | 23.76 |
| Example 4 | 1.8 | 336 | 23.71 |
| Example 5 | 0.5 | 870 | 23.68 |
| Example 6 | 1.0 | 622 | 23.72 |
| Example 7 | 1.4 | 425 | 23.77 |
| Example 8 | 0.8 | 647 | 23.78 |
| Example 9 | 0.5 | 773 | 23.70 |
| Example 10 | 1.1 | 651 | 23.71 |
| Example 11 | 1.5 | 422 | 23.75 |

TABLE 4-continued

| | Performance test results | | |
|---|---|---|---|
| Item | Specific contact resistivity/ $mQ \cdot cm^2$ | Metal induced recombination/ $fA \cdot cm^-$ | Conversion efficiency/ % |
| Comparative Example 1 | 12.5 | 295 | 23.34 |
| Comparative Example 2 | 5.3 | 566 | 23.47 |

It can be seen from Table 4 that the conversion efficiencies of the solar cells printed with the electrode pastes shown in Examples 1 to 11 are higher than those of Comparative Examples 1 to 2, indicating that the electrode pastes prepared with the formulations disclosed in the present invention can improve the conversion efficiency of solar cells. It can well balance contact resistance and metal induced recombination.

Finally, it should be noted that the above embodiments are only used to illustrate the technical solutions of the present invention and not to limit the protection scope of the present invention. Although the present invention is described in detail with reference to the preferred embodiments, those of ordinary skill in the art should understand that, the technical schemes of the present invention may be modified or equivalently replaced without departing from the spirit and scope of the technical solutions of the present invention.

The invention claimed is:

1. An electrode paste in contact with a p+emitter of an N-type solar cell, comprising the following components by weight: 80-90 parts of a conductive silver powder, 0.5-3 parts of an aluminum powder, 3-8 parts of a glass powder, 0.1-2 parts of a lanthanum-aluminum alloy powder or a lanthanum-ytterbium-aluminum alloy powder, 6-10 parts of an organic vehicle and 0-2 parts of an auxiliary agent.

2. The electrode paste in contact with a p+ emitter of an N-type solar cell according to claim 1, wherein the mass fraction of aluminum in the lanthanum-aluminum alloy powder or the lanthanum-ytterbium-aluminum alloy powder is ≥99.1%; the particle size $D_{50}$ of the lanthanum-aluminum alloy powder or the lanthanum-ytterbium-aluminum alloy powder is 0.5-5 μm.

3. The electrode paste in contact with a p+ emitter of an N-type solar cell according to claim 2, wherein the particle size $D_{50}$ of the lanthanum-aluminum alloy powder or the lanthanum-ytterbium-aluminum alloy powder is 1-3 μm.

4. The electrode paste in contact with a p+ emitter of an N-type solar cell according to claim 1, wherein the conductive silver powder comprises a silver powder and/or a silver alloy powder; the silver powder includes at least one of spherical silver powder, flake silver powder, microcrystalline silver powder.

5. The electrode paste in contact with a p+ emitter of an N-type solar cell according to claim 4, wherein the silver powder is a mixture of a spherical silver powder and a microcrystalline silver powder, and the mass fraction of the spherical silver powder is ≥80%, wherein a particle size $D_{50}$ of the spherical silver powder is 0.1-5 μm; the microcrystalline silver powder is a nano-silver powder, and its particle size $D_{50}$ is 10-400 nm.

6. The electrode paste in contact with a p+emitter of an N-type solar cell according to claim 1, wherein, the glass powder comprises lead oxide, silicon dioxide, zinc oxide, a third main group oxide, a fluxing agent, and a lanthanide oxide in a molar ratio of:

lead oxide: silicon dioxide: zinc oxide: third main group oxide: fluxing agent: lanthanide oxide =(30-60):(3-15):(3-15):(20-50):(1-15):(1-10).

7. The electrode paste in contact with a p+ emitter of an N-type solar cell according to claim 6, wherein a softening point of the glass powder is 350-450° C.

8. The electrode paste in contact with a p+emitter of an N-type solar cell according to claim 1, wherein a particle size D50 of the aluminum powder is 1-3 μm, and its particle size $D_{100}$ is less than 10 μm; a mass fraction of active aluminum is 98.3-99.8% according to a redox titration of aluminum powder activity.

9. The electrode paste in contact with a p+ emitter of an N-type solar cell according to claim 1, wherein the organic vehicle comprises the following components: a solvent, an organic resin, a dispersant and a thixotropic agent in a weight ratio of solvent:
organic resin: dispersant: thixotropic agent =(60-80):(5-20):(1-5):(1-5).

10. A preparation method of the electrode paste in contact with a p+ emitter of an N-type solar cell according to claim 6, comprising the following steps:
   (1) mixing lead oxide, silicon dioxide, zinc oxide, a third main group oxide, a fluxing agent and a lanthanide oxide uniformly, smelting a resulting mixture at 900-1100° C. for 30-90 min, quenching with water, ball milling for 6-15 h to obtain a glass slurry, letting the glass slurry stand still to separate and remove a supernatant clear liquid, and drying a resulting solid residue at 100-150° C. to obtain a glass powder; and
   (2) mixing the glass powder, a conductive silver powder, an aluminum powder, a lanthanum-aluminum alloy powder or a lanthanum-ytterbium-aluminum alloy powder, an organic vehicle and an auxiliary agent uniformly, and grinding to obtain an electrode paste with a fineness of ≤10 μm.

11. A preparation method of the electrode paste in contact with a p+ emitter of an N-type solar cell according to claim 7, comprising the following steps:
   (1) mixing lead oxide, silicon dioxide, zinc oxide, a third main group oxide, a fluxing agent and a lanthanide oxide uniformly, smelting a resulting mixture at 900-1100° C. for 30-90 min, quenching with water, ball milling for 6-15 h to obtain a glass slurry, letting the glass slurry stand still to separate and remove a supernatant clear liquid, and drying a resulting solid residue at 100-150° C. to obtain a glass powder; and
   (2) mixing the glass powder, a conductive silver powder, an aluminum powder, a lanthanum-aluminum alloy powder or a lanthanum-ytterbium-aluminum alloy powder, an organic vehicle and an auxiliary agent uniformly, and grinding to obtain an electrode paste with a fineness of ≤10 μm.

12. A preparation method of the electrode paste in contact with a p+ emitter of an N-type solar cell according to claim 8, comprising the following steps:
   (1) mixing lead oxide, silicon dioxide, zinc oxide, a third main group oxide, a fluxing agent and a lanthanide oxide uniformly, smelting a resulting mixture at 900-1100° C. for 30-90 min, quenching with water, ball milling for 6-15 h to obtain a glass slurry, letting the glass slurry stand still to separate and remove a supernatant clear liquid, and drying a resulting solid residue at 100-150° C. to obtain a glass powder; and
   (2) mixing the glass powder, a conductive silver powder, an aluminum powder, a lanthanum-aluminum alloy powder or a lanthanum-ytterbium-aluminum alloy powder, an organic vehicle and an auxiliary agent uniformly, and grinding to obtain an electrode paste with a fineness of ≤10 μm.

13. A preparation method of the electrode paste in contact with a p+ emitter of an N-type solar cell according to claim 9, comprising the following steps:
   (1) mixing lead oxide, silicon dioxide, zinc oxide, a third main group oxide, a fluxing agent and a lanthanide oxide uniformly, smelting a resulting mixture at 900-1100° C. for 30-90 min, quenching with water, ball milling for 6-15 h to obtain a glass slurry, letting the glass slurry stand still to separate and remove a supernatant clear liquid, and drying a resulting solid residue at 100-150° C. to obtain a glass powder; and
   (2) mixing the glass powder, a conductive silver powder, an aluminum powder, a lanthanum-aluminum alloy powder or a lanthanum-ytterbium-aluminum alloy powder, an organic vehicle and an auxiliary agent uniformly, and grinding to obtain an electrode paste with a fineness of ≤10 μm.

* * * * *